United States Patent [19]

Furrey

[11] Patent Number: 4,860,107

[45] Date of Patent: Aug. 22, 1989

[54] VIDEO DISPLAY DRIVER APPARATUS

[75] Inventor: John H. Furrey, Indianapolis, Ind.

[73] Assignee: Thomson Consumer Electronics, Inc., Princeton, N.J.

[21] Appl. No.: 174,057

[22] Filed: Mar. 28, 1988

[51] Int. Cl.$^4$ .......................... H04N 5/68; H04N 5/59
[52] U.S. Cl. ..................................... 358/184; 358/242; 358/164
[58] Field of Search ............... 358/184, 188, 242, 243, 358/166, 164

[56] References Cited

U.S. PATENT DOCUMENTS

| 4,237,479 | 2/1980 | Lavigne | 358/33 |
| 4,589,032 | 5/1986 | Morey | 358/184 |

OTHER PUBLICATIONS

Article "Towards True Color Stability in Television'-'-A. Lavigne, Videocolor Applications Note, Jun. 1978, FIG. 3.
Schematic circuit diagram for Metz color television chassis 685 G-1.

Primary Examiner—Thommy P. Chin
Attorney, Agent, or Firm—Peter M. Emanuel; Ronald H. Kurdyla; Frederick A. Wein

[57] ABSTRACT

A video signal is coupled from the output of a display driver amplifier to an image display device via a coupling network including cascaded emitter follower transistors of opposite conductivity type. First and second diodes are respectively connected across the base-emitter junctions of each transistor and are poled for forward current conduction in a direction opposite to that of the associated base-emitter junction. The coupling network significantly reduces the value of capacitance of the display device as presented to the output of the driver amplifier, thereby improving positive and negative video signal transient response.

5 Claims, 1 Drawing Sheet

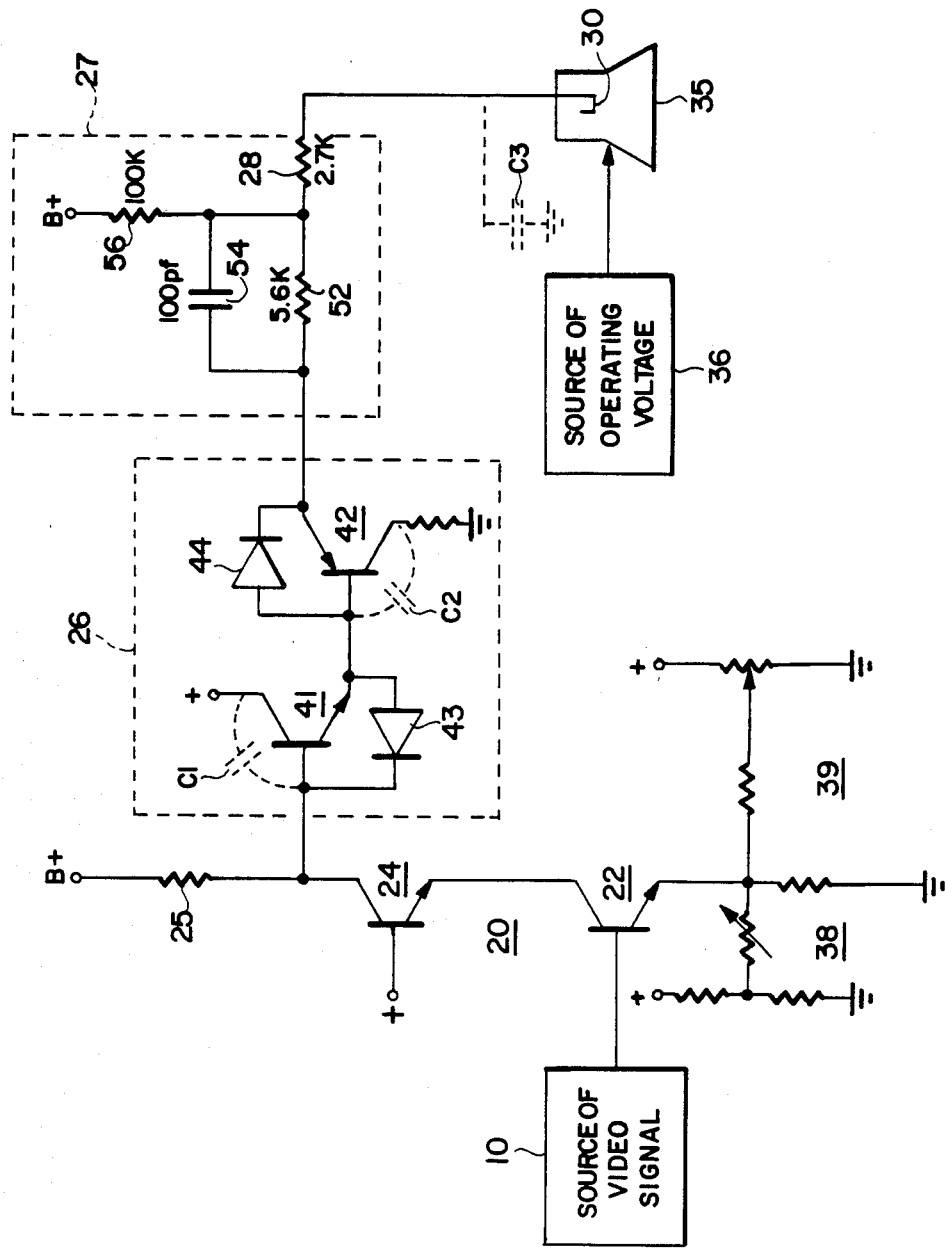

VIDEO DISPLAY DRIVER APPARATUS invention concerns a display driver amplifier and output signal coupling network for providing a high level video output signal to an image display device. In particular, this invention concerns such apparatus with increased high frequency response.

In a television receiver a video output display driver amplifier provides a high level video output signal to an image display device such as a kinescope. The video output signal is conveyed via an output signal coupling path to a signal input electrode of the kinescope, e.g., a cathode electrode. The kinescope signal input electrode can exhibit a capacitance which is large enough to impair the high frequency response of the video signal developed at the output of the driver amplifier. Thus it is desirable to reduce the effect of the kinescope capacitance upon the driver amplifier output signal, thereby preventing degraded video signal high frequency response and degraded image resolution.

This objective is achieved by means of a video output signal coupling path in accordance with the principles of the present invention. In an illustrated preferred embodiment of the invention, the video output signal coupling path conveys a video signal from the output of the display driver amplifier to the input of the kinescope by means of first and second cascaded emitter follower transistors of opposite conductivity type. The follower transistors respectively isolate the display driver output from the kinescope capacitance in the presence of positive and negative video signal amplitude excursions. First and second unilateral current conducting devices, such as diodes, are respectively connected across the base-emitter junctions of each transistor and are poled for forward current conduction in a direction opposite to that of the ass base-emitter junction.

of the drawing illustrates a portion of a television receiver including a video output signal coupling network in accordance with the principles of the present invention.

A low level video signal from a source 10 is applied to a kinescope driver stage 20 including an input low voltage common emitter amplifier transistor 22 arranged in a cascode video amplifier configuration with an output high voltage common base amplifier transistor 24. A high level amplified video signal with a magnitude suitable for driving a signal input cathode electrode 30 of a kinescope 35 is developed in a collector output circuit of transistor 24, including a load resistor 25 coupled to a high operating voltage B+ (e.g., +230 volts). An amplified video output signal developed across resistor 25 is coupled to cathode electrode 30 via a network 26, a frequency compensated drive level compensation network 27 in accordance with the principles of the present invention, and a kinescope arc current limiting resistor 28, commonly referred to as a "flashover" resistor, operatively associated with network 27. The signal gain and the DC bias of driver stage 20 are respectively adjusted by means of a variable resistor 38 and a potentiometer 39 in the emitter circuit of transistor 22. Operating voltages for kinescope 35 are provided by a source 36.

A capacitance C3 represents parasitic kinescope and wiring capacitance associated with kinescope cathode electrode 30. The value of this capacitance is approximately 9 picofarads and can result in significant high frequency degradation if it is permitted to influence the video signal developed across resistor 25 in the output circuit of transistor 24. Network 26 is arranged to reduce or eliminate such high frequency degradation by decoupling such capacitance from the collector output circuit of transistor 24.

Coupling network 26 includes an NPN emitter follower transistor 41 with a low impedance emitter output electrode and a PNP emitter follower transistor 42 with a low impedance emitter output electrode arranged in cascade in the output signal path from the collector output circuit of transistor 24 to kinescope 30. Parasitic collector-base capacitances C1 and C2, e.g., 2 picofarads, are respectively associated with transistors 41 and 42 and include stray wiring and layout capacitances. Diodes 43 and 44 are coupled across the base-emitter junctions of transistors 41 and 42, respectively, and are poled for forward current conduction in a direction opposite to the forward current conduction direction of the associated base-emitter junction.

A rapid positive amplitude transition, which contains significant high frequency image detail information, is conveyed to kinescope 35 via conductive transistor 41 and conductive diode 44. Diode 43 and transistor 42 are reverse biased (nonconductive) at this time.

In the case of a rapid positive-going video signal amplitude transition at the collector output of transistor 24, the capacitance presented to the collector output of transistor 24 is substantially equal to $$C1 + C2/\beta 41 + C3/\beta 41 \qquad (1)$$

where capacitances C1, C2 and C3 are as discussed above and $\beta 41$ is the forward current gain (Beta) of transistor 41, typically 100 minimum. Thus at the collector of driver transistor 24 the value of kinescope capacitance C3 is greatly reduced by the Beta ($\beta$) of transistor 41, and the value of relatively small capacitance C2 is reduced further by the Beta of transistor 41. Resistor 28 assists to isolate the kinescope capacitance from the output circuit of driver transistor 24, but the effect of such action is much less than that produced by network 26.

Rapid negative amplitude transitions, which also contain significant high frequency image detail information, are conveyed to kinescope 35 via conductive diode 43 and transistor 42. Transistor 41 and diode 44 are reverse biased at this time. For rapid negative-going video signal amplitude transitions at the collector output of transistor 24, the capacitance presented to the collector output of transistor 24 is substantially equal to $$C1 + C2 + C3/\beta 42 \qquad (2)$$

where $\beta 42$ is the forward current gain of transistor 42, typically 100 minimum. Thus the relatively large value of kinescope capacitance C3 is greatly reduced by the Beta of transistor 42 at the collector of driver transistor 24.

A relatively large bypass capacitor 54 shunting a resistor 52 in network 27, as will be discussed subsequently, has a negligible effect upon the value of capacitance given by expressions (1) and (2) above since the value of capacitance presented to the emitter of transistor 42 is dominated by capacitance C3.

Note that the base-emitter junctions of transistors 41 and 42 are not bypassed by capacitors. Such bypassing of one or both of these transistors would defeat the purpose of isolating the output circuit of transistor 24 from capacitances such as kinescope capacitance C3 and capacitor 54 in this example, in the presence of positive or negative signal amplitude transients or both.

A display driver stage including coupling network 26 has been found to exhibit a significant improvement in high frequency response due to decoupling kinescope capacitance C3 from the output circuit of transistor 24, as well as a substantially symmetrical positive and negative transient response. In the latter regard it is noted that expressions (1) and (2) above contain different values of capacitance for positive and negative amplitude transients. The difference is small, however, and transistor 24 can more easily drive a capacitive load when exhibiting increasing current conduction and an associated decreasing collector impedance in response to negative signal amplitude excursions, compared to driving a capacitance when exhibiting decreasing conduction and increasing collector impedance in response to positive amplitude excursions.

Network 26 can assume configurations other than that shown. For example, when a PNP transistor is employed for driver 24 the positions of transistors 41 and 42 with associated diodes 43 and 44 should be interchanged.

With the disclosed arrangement the value of collector load resistor 25 can be lowered in value because the kinescope does not directly load the collector circuit of transistor 24, i.e., the collector circuit is buffered via follower transistors 41 and 42. A lower value of collector load resistance advantageously enhances high frequency response since a smaller resistance value produces less of a lowpass filtering effect together with parasitic collector circuit capacitances.

Network 27 includes a series coupling resistor 52 and a frequency compensation capacitor 54 arranged in parallel as shown, together with flashover resistor 28. A resistor 56 is coupled between an operating voltage (B+) and a point in the signal path to which capacitor 54 is coupled.

Network 27 compensates for the tendency of an image display device such as kinescope 35 to "bloom", or conduct excessive current, when driven by a large magnitude video signal from a low impedance source such as the emitter output of PNP follower transistor 42. To this end resistor 28 and resistor 52 do not develop a significant voltage drop for kinescope current conduction in response to a video signal of low to moderate magnitude. However, resistors 52 and 28 develop a significant voltage drop for kinescope current conduction in response to a large magnitude video signal, e.g., representative of a bright image. This voltage drop reduces the signal drive to kinescope cathode electrode 30, thereby reducing or eliminating the likelihood that the kinescope will "bloom" under large signal conditions. The values of resistors 52 and 28 and capacitor 54 are chosen to yield a desired display drive impedance, particularly at low through middle video signal drive levels which determine image brightness and intensity, so as to maintain kinescope current conduction in accordance with a gamma correction function as is known. The values of resistors 52 and 28 can be tailored to provide a desired amount of gamma correction depending on the type of kinescope and its current conduction characteristics.

Capacitor 54 is a high frequency bypass element to compensate for a high frequency loss associated with a lowpass filtering effect produced by the coaction of kinescope capacitance C3 with resistors 28 and 52. The high frequency compensation provided by network 27 begins at approximately 500 KHz, which is well within the DC to 4.2 MHz video signal band according to NTSC standards. The amount of high frequency compensation, including high frequency boost, is a function of the values of capacitor 54, resistors 52 and 28, capacitance C3 and the impedance of kinescope cathode 30. The impedance of cathode 30 is a function of the current conduction level of cathode 30. In this example, more high frequency compensation is provided at higher cathode current levels.

Capacitor 54 could be coupled across resistor 28 instead of across resistor 28 as illustrated. However, it is preferred that the non-bypassed resistor be located as close to the kinescope as possible to minimize the damage to circuit boards and associated circuit elements due to kinescope arcing. Placing bypass capacitor 54 across both resistors 52 and 28 would defeat the intended arc current protection since such a capacitor coupling would provide an arc current path circumventing the current limiting effect of resistor 28 in this case.

Resistor 56 provides a bias for kinescope cathode 30 to assure that the kinescope is blanked during retrace intervals. Resistor 56 also assists capacitor 54 in providing the desired high frequency compensation at various signal drive levels. Specifically, resistor 56 helps to stabilize the effective impedance presented to the network including resistor 52 and capacitor 54, in the presence of kinescope impedance variations associated with changes in the level of kinescope current conduction due to changes in the drive signal level.

What is claimed is:
1. A video signal processing system comprising:
   an image display device having a signal input electrode with an associated capacitance;
   a display driver amplifier having a signal input for receiving a video signal containing information to be displayed, and having an output circuit for developing a video output signal with a magnitude suitable for driving said image display device; and
   a signal coupling path for conveying said video output signal from said output circuit to said signal input electrode of said image display device; wherein for reducing the effect of said associated

,capacitance upon said output circuit of said display driver amplifier said signal coupling path comprising:

a first emitter follower transistor having a base input electrode coupled to said output circuit of said driver amplifier, a collector electrode and an emitter output electrode, for isolating said output circuit of said driver amplifier from said associated capacitance in the presence of video signal amplitude transients of one polarity;

a second emitter follower transistor arranged in cascade with said first transistor and having a base input electrode coupled to said emitter output electrode of said first transistor, a collector electrode and an emitter output electrode coupled to said signal input electrode of said display device, for isolating said output circuit of said driver amplifier from said capacitance in the presence of video signal amplitude transients of another polarity;

a first unidirectional current conducting semiconductor device coupled across a base-emitter junction of said first transistor and poled for forward current conduction in a direction opposite to that of said base-emitter junction of said first transistor; and a second unidirectional current conducting semiconductor device coupled across a base-emitter junction of said second transistor and poled for forward current conduction in a direction opposite to that of said base-emitter junction of said second transistor.

2. A system according to claim 1, wherein
said display drive amplifier is a transistor of the same conductivity type as said first transistor.

3. A system according to claim 1, wherein
said first and second transistors are NPN and PNP devices, respectively.

4. A system according to claim 1, wherein said signal coupling path includes
first and second resistors coupled in series in the order named from said emitter output of said second transistor to said signal input electrode of said image display device; and
a capacitor coupled across said first resistor.

5. A system according to claim 4 and further comprising
a third resistor coupled from a voltage source to a point between said first and second resistors.

* * * * *